(12) United States Patent
Senninger et al.

(10) Patent No.: US 9,329,217 B2
(45) Date of Patent: May 3, 2016

(54) SENSOR ASSEMBLY FOR DETECTING AN APPROACHING AND/OR CONTACTING OBJECT, AND METHOD FOR ASSEMBLING A SENSOR ASSEMBLY

(75) Inventors: Christian Senninger, Otterfing (DE); Oliver Weiss, Munich (DE); Achim Rein, Munich (DE); Judith Ihle, Munich (DE); Oliver Wiesener, Munich (DE); Jens Vor Der Brüggen, Unterschleißheim (DE)

(73) Assignee: Schreiner Group Gmbh & Co. KG, Oberschleissheim (DE)

( * ) Notice: Subject to any disclaimer, the term of this patent is extended or adjusted under 35 U.S.C. 154(b) by 99 days.

(21) Appl. No.: 13/824,330

(22) PCT Filed: Oct. 18, 2011

(86) PCT No.: PCT/EP2011/005224
§ 371 (c)(1),
(2), (4) Date: May 24, 2013

(87) PCT Pub. No.: WO2012/052153
PCT Pub. Date: Apr. 26, 2012

(65) Prior Publication Data
US 2013/0241576 A1    Sep. 19, 2013

(30) Foreign Application Priority Data

Oct. 21, 2010 (DE) .......................... 10 2010 049 006

(51) Int. Cl.
*H03K 17/96* (2006.01)
*G01R 27/26* (2006.01)
*B29C 45/14* (2006.01)

(52) U.S. Cl.
CPC ............ *G01R 27/2605* (2013.01); *B29C 45/14* (2013.01); *H03K 17/962* (2013.01); *H03K 2017/9606* (2013.01); *H03K 2217/960755* (2013.01); *H03K 2217/960785* (2013.01)

(58) Field of Classification Search
USPC ............ 324/207.13, 220, 242, 243, 530, 324/207.22, 658, 661; 428/1.6, 7, 19, 1.61, 428/13, 14, 1.3, 811.2, 813, 811.4, 214; 362/123, 284, 249.04, 236; 160/399, 160/400, 344; 156/234, 456, 219, 79, 277, 156/498, 235, 242, 493; 264/328.8; 345/173; 29/592.1, 592, 593, 825; 327/517; 438/107, 118, 64

See application file for complete search history.

(56) References Cited

U.S. PATENT DOCUMENTS 5,356,576 A * 10/1994 Fischbach .................... 264/40.4
7,098,414 B2 * 8/2006 Caldwell ....................... 200/310

(Continued)

FOREIGN PATENT DOCUMENTS

DE     19650468 C1    3/1998
DE     10141634 A1    3/2003

(Continued)

OTHER PUBLICATIONS

International Search Report; PCT/EP2011/005224; Feb. 24, 2012.

*Primary Examiner* — Melissa Koval
*Assistant Examiner* — Nasima Monsur
(74) *Attorney, Agent, or Firm* — Studebaker & Brackett PC

(57) ABSTRACT

A sensor assembly and method for producing a sensor assembly for detecting an approaching and/or contacting object. The sensor assembly includes at least one sensor support surface having a first flat side and a second flat side, a proximity and/or contact sensor, which is connected to the first flat side and/or to the second flat side of the sensor support surface, a decoration support medium having a first support flat side and a second support flat side, and a decoration layer, which is connected to the first support flat side and/or to the second support flat side of the decoration support medium and/or is an integral part of the decoration support medium. The decoration support medium includes a glass or plastic film or panel which is back-molded on the first support flat side thereof and/or on the second support flat side, directly or indirectly, using an injection molding material.

15 Claims, 3 Drawing Sheets

(56) References Cited

U.S. PATENT DOCUMENTS

Figure 1:
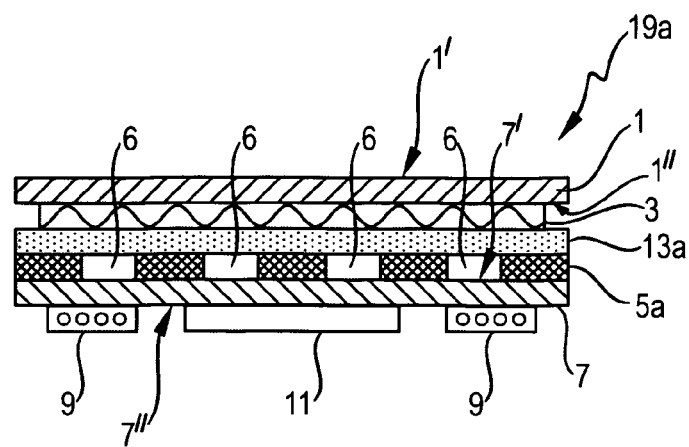

| | | | |
|---|---|---|---|
| 7,476,848 B2* | 1/2009 | Argast et al. | 250/239 |
| 2003/0121767 A1* | 7/2003 | Caldwell | 200/512 |
| 2003/0122794 A1* | 7/2003 | Caldwell | 345/173 |
| 2006/0188595 A1* | 8/2006 | Furukawa | B29C 45/14262 425/129.1 |
| 2007/0269671 A1* | 11/2007 | Hirschfelder | B29C 45/1418 428/542.6 |
| 2008/0095992 A1* | 4/2008 | Hirschfelder | B29C 45/14811 428/200 |
| 2009/0072883 A1 | 3/2009 | Ehrlich et al. | |
| 2009/0269537 A1* | 10/2009 | Manabe | 428/43 |
| 2010/0155206 A1 | 6/2010 | Arione et al. | |
| 2010/0159183 A1* | 6/2010 | Nishimura | B29C 45/14639 428/77 |

FOREIGN PATENT DOCUMENTS

| | | |
|---|---|---|
| DE | 10307473 A1 | 9/2004 |
| DE | 10338614 A1 | 3/2005 |
| DE | 102004038752 A1 | 2/2006 |
| DE | 60219369 T2 | 12/2007 |
| DE | 102008028313 A1 | 12/2009 |
| EP | 1446879 A2 | 8/2004 |
| EP | 1626331 A2 | 2/2006 |
| EP | 1542363 B1 | 4/2007 |
| EP | 2048781 A1 | 4/2009 |
| EP | 2133997 A1 | 12/2009 |
| EP | 1446879 B1 | 5/2010 |
| WO | 03/044957 A2 | 5/2003 |

* cited by examiner

SENSOR ASSEMBLY FOR DETECTING AN APPROACHING AND/OR CONTACTING OBJECT, AND METHOD FOR ASSEMBLING A SENSOR ASSEMBLY

The present invention relates to a sensor assembly for detecting an approaching and/or contacting object, for example a human finger. It also relates to a method for assembling such a sensor assembly.

Sensor assemblies for detecting approaching or contacting objects are nowadays better known under the term "touch sensor". Touch sensors are applied in many technical fields, in particular, where simple, easy-to-use user interfaces need to be provided, which generate, in the manner of a simple switch for example, an electrical or electronic signal which is used to influence the operation of a electrically or electronically controlled component.

European Patent EP 1 446 879 B1 discloses, on the one hand, a novel form of touch sensors and outlines the previously known prior art in the design of touch sensors produced on the basis of films or substrates. The common feature of the embodiments described there is the fact that a decoration layer is used, which is positioned such that its position corresponds to that of a sensing element. This sensor element is implemented as an electrode which acts as part of a capacitor. The "detuning" of this capacitor indicates that an object, for example, a human finger, is located in the vicinity of the electrode. In the prior art described there the decoration layer is mounted on its own substrate, while the sensor-electrode is applied onto a second substrate. These two substrates are then connected to each other. In contrast, EP 1 446 879 B1 claims an invention in which the decoration layer is integrally connected to the sensor electrode or to its carrier substrate.

The problem addressed by the present invention is to provide an alternative construction of a sensor assembly to the solutions previously described.

This problem is solved by a sensor assembly according to Claim 1 and a method according to Claim 14.

Accordingly, a sensor assembly of the above-mentioned type comprises at least
- a sensor support surface with a first flat side and a second flat side,
- a proximity and/or contact sensor, which is connected to the first flat side and/or the second flat side of the sensor support surface,
- a decoration support medium with a first support flat side and a second support flat side,
- a decoration layer, which is connected to the first support flat side and/or the second support flat side of the decoration support medium and/or is an integral part of the decoration support medium.

The decoration support medium comprises according to the invention a glass or plastic film or panel which is back-moulded on the first support flat side thereof and/or the second support flat side, directly or indirectly, using an injection-moulding material.

The sensor support surface is a planar substrate, for example in the form of a film or a panel. This substrate need not necessarily be implemented completely flat, but may have contours, which means it may also be implemented as a three-dimensional component that is press-moulded as an essentially flat thin layer. Its surface need not necessarily be flat, but can also be curved. The proximity and/or contact sensor preferably comprises at least one electrode layer which is particularly preferably printed, advantageously by silk-screen printing technology, since this allows greater layer thicknesses to be achieved. The decoration support medium can also be constructed analogously to the sensor support surface, that is to say, again as a planar substrate, namely as a glass or plastic film or panel. The decoration layer can either be a separate layer, preferably a printed layer applied by screen printing, which is connected to one of the two support flat sides of the decoration support medium, or it can be integrated into the decoration support medium. Such an integration into the decoration support medium can be realized, for example, by a visible pigment of the decoration support medium.

The decoration support medium is then back-moulded with an injection-moulding material, wherein the term "back-moulding" is understood as any type of moulding of an injection-moulding material directly or indirectly to the decoration support medium. In addition to an injection process behind the decoration support medium, it also subsumes an over-moulding and an injection process, as well as any combination of these methods.

The step of back-moulding can provide a whole range of unexpected advantages, which can, for example, significantly improve the value, practicality and the range of applications of such sensor assemblies as have hitherto been known in accordance with the above prior art. First of all, the back-moulding process can be used to increase the stability of the decoration support medium and ultimately that of the whole sensor assembly. Almost any desired layer thicknesses can therefore be realized. The layer thickness is preferably selected such that the contact and/or proximity sensor retains an adequate detection range. In addition to providing reinforcement of the decoration support medium, this can also have the effect that the surface of the sensor assembly thereby obtains a three-dimensional shape, for example, a shape which in addition to the decoration, indicates where a finger or other object must be moved near to the surface of the sensor assembly in order to activate the proximity or contact sensor. In this manner, for example an additional Braille label can also be applied on the surface. A three-dimensional shape can also serve, however, to generate or to enhance visual effects, for example by the construction of a magnifying lens. In general, a three-dimensionally structured back-moulding treatment can be used to achieve an attractive, enhanced shape, in particular one that is adapted to the purpose for which the sensor assembly is used. In addition to providing colouring, due to the decoration layer the back-moulding treatment has an informative and/or aesthetic effect, and additional features can also be integrated into the sensor assembly.

The decoration support medium is preferably transparent (this is also to be understood in a broader sense to include translucent), in particular, when the decoration layer is arranged on the support flat side that faces away from a user. The user can then identify the decoration layer underneath. This transparency is advantageous particularly when the sensor assembly is backlit, as is discussed in further detail below. A transparent design of the decoration support medium is also to be understood as including partial transparency. In addition to transparent areas the decoration support medium can thus also have opaque areas.

It is particularly advantageous if the decoration support medium and the injection-moulding material have as similar properties as possible, in particular a similar melting point. In other words, it is preferred that the injection-moulding material is selected such that it bonds well with the decoration support medium, preferably when it is used for back-moulding. It is particularly preferred, therefore, if the decoration support medium and the injection-moulding material comprise the same material. Either a direct or indirect injection back-moulding of the decoration support medium is provided. This is to be understood as meaning that auxiliary layers, such as connecting layers or other layers, may also be arranged either over the whole or part of the surface between the decoration support medium and the injection-moulding material, even the decoration layer, for example. If the injection-moulding material and the decoration support medium are indirectly connected to each other in this manner, the same considerations given above in relation to the choice of material for the injection-moulding material and decoration support medium also apply to the choice of material for the intermediate layer and the decoration support medium. A further requirement on the injection-moulding material is that it is preferably transparent, in particular when the decoration layer is located thereunder.

The method according to the invention of the above-mentioned type comprises at least the following steps:
 providing a sensor support surface with a first flat side and a second flat side,
 connecting a proximity and/or contact sensor to the first flat side and/or the second flat side of the sensor support surface,
 providing a decoration support medium with a first support flat side and a second support flat side, wherein the decoration support medium comprises a glass or plastic film or panel,
 connecting a decoration layer to the first support flat side and/or the second support flat side of decoration support medium, and/or providing a decoration layer as an integral part of the decoration support medium,
 back-moulding of the decoration support medium on the first support flat side and/or the second support flat side with an injection-moulding material,
 connecting the decoration support medium to the sensor support surface.

The sequence of these steps can be chosen almost arbitrarily, wherein the logic of the situation dictates that the first two steps belong together and can be understood as a unit, in the same way as the third, fourth and fifth steps (the latter in turn being interchangeable with each other in terms of their temporal sequence).

A particularly effective, hence advantageous, form of the method consists in the back-moulding of the decoration support medium and its connection to the sensor support surface being carried out in a single operation step. This can involve for example, using the heat generated in the back-moulding process to produce the connection between the decoration support medium and the sensor support surface at the same time. This can be realized, for example, by arrangement of a contact layer, that can be activated by application of heat and/or pressure, on the support flat side facing the sensor support surface of the decoration support medium.

Particularly preferably, the decoration support medium undergoes a forming process before the injection moulding. It has therefore already been given a three-dimensional shape, which can be finally reinforced and therefore stabilized by the injection-moulding material. Possible processes in this context are, for example, deep-drawing methods based on cold-working or hot-forming principles, as well as other processes, such as blow forming, rolling and many others. As a result of the back-moulding it is possible not only to stabilize the decoration support medium, but also if required to produce a flat surface which faces in the direction of the sensor support surface, so that the connection of the decoration support medium and the sensor support surface can be carried out simply and straightforwardly in spite of the three-dimensional shape of the decoration support medium.

Further particularly advantageous designs and extensions of the invention also arise from the dependent claims and the following description. The method according to the invention can thus also be developed to form a sensor assembly according to the dependent claims.

Preferably the sensor support surface and the decoration support medium are partially connected to each other, directly or indirectly, along at least one of their flat sides and support flat sides.

This optionally results in further significant advantages: firstly, in this way a releasable connection can be realized between the sensor support surface and the decoration support medium, so that the two are more easily separable from each other, e.g. for purposes of separation during recycling or when replacing subcomponents of the sensor assembly. Secondly, when using such a connection, material, such as adhesive, can be saved. Thirdly, the connection can be made exactly at a point where it does not interfere with the operation of the sensor assembly. Thus the connection (again, for example, an adhesive joint) can be prevented, for example, from interfering with the propagation of the electric field of the contact sensor. For this purpose it can be provided that the cutout of an adhesive is positioned exactly where the contact sensor is located, in a layer above or below it. Similar behaviour occurs with backlights of the sensor assemblies, on which further details are given below. In general, this is because optical interference effects can be avoided by using such a connection means, if this connection means is cut out at the locations where a user looks through any given layer of the sensor assembly at an underlying layer. Fourthly, a further advantage is to be found in that the sensor support surface and the decoration support medium can also be connected to each other only during the installation of the sensor assembly on site. Up to this point in time, the two can be held in stock as separate parts. It is thereby possible, for example, to produce one of the two, such as the sensor support surface with the contact sensor, in large quantities as a standard material, while the other, preferably the decoration support medium with the decoration layer, can be individually configured as required, provided for example, with a customer-specific and/or application-specific decoration. Such a specific decoration may provide, for example, labels in different languages, or different symbols. Once the exact application occurs, the two are then simply connected to each other.

A partial connection preferably comprises a surface connection implemented over a part of the surface. This therefore means a partial connection along the surfaces facing each other, for example by welding. Particularly preferably, the sensor support surface and the decoration support medium are connected to each other by an adhesive joint. In addition to adhesive joints using adhesives, this is also understood to mean such connections as are produced with curable adhesive paints or with similar substances based on adhesive action, which connect the sensor support surface and the decoration support medium to each other either permanently or non-permanently (i.e. releasably). Such adhesive joints are simple to produce, suitable adhesives for the purpose are available in almost limitless qualities, strengths and material composition and can therefore be precisely matched to the exact installation location of the sensor assembly.

A first extension of this embodiment with adhesive connection is realized by the adhesive joint having an adhesive surface with local cutouts. Such cutouts can be manufactured by producing so-called adhesive spots or by means of an adhesive lattice, for example by screen printing. Instead of printing however, the adhesive can also be laminated from another support medium in pre-fabricated form. Local cutouts can also be realized by producing an adhesive frame, by printing or other means. Such a frame is particularly preferred when, for example, adhesive is to be removed selectively in a decoration region of the sensor assembly, in order to avoid the above-mentioned visual interference effects. The same applies to the cutout in a region of the contact and/or proximity sensor.

A second extension, which can be applied as an alternative to or in addition to the first extension, is that the adhesive joint has an adhesive surface, the adhesion of which is at least partially weakened. Such a reduction or complete elimination of the adhesion can be obtained by a so-called adhesive killer, for example, a partially applied print varnish, or by local application of a film, each of which covers the adhesive. The local weakening of the adhesion offers the advantage that adhesive layers covering the whole surface can be used, such as those available in pre-assembled form, for example, as a coated film substrate, in a large range of materials and properties. This then involves a standard material, which then need only be post-treated to partially reduce the adhesion. As already mentioned above, the weakening of the adhesion can also be understood to mean a significant reduction of this effect in this local region, preferably by at least 50% of the local adhesive force.

All of these variants described above thus provide a partial surface connection. However, it is also possible to provide a full surface connection instead. This has advantages particularly when the back-moulding faces towards the sensor support surface, which means it can be the case that a stronger connecting effect, for example, adhesion of an adhesive glue, is desired.

A further possibility is that no surface connection is realized at all. The connection is then achieved by holding together the individual components of the sensor assembly elsewhere; preferably the sensor support surface and the decoration support medium are then directly or indirectly connected to each other by means of a clamp connection. To this end it is particularly preferred that the decoration support medium and/or the injection-moulding material and/or the sensor support surface form a clamping frame. It is precisely the construction of the clamping frame from the injection-moulding material that offers the significant advantage that the three-dimensional shape already produced in the back-moulding can at the same time also be used to form the functional element of the clamping frame. This allows many extra steps and production costs to be saved in comparison to a separate production of a clamping frame.

Such a clamping frame can also comprise further elements, separate from the sensor assembly, which only form the completed clamping frame once they are combined with elements of the sensor assembly. Clamping has the advantage, in particular, that the connection need only be completed on-site at the time of the final installation of the sensor assembly, wherein of course an earlier connection is also possible, at least in principle. It should also be noted that in principle, the variants of the surface connection (whether partial or full-surface) and of the clamping can also be combined with each other, for example, to initially tack the components together by means of the surface connection, and then using the clamping to provide additional contact force sufficient for the deployment of the sensor assembly.

In addition, the sensor assembly preferably has a lamp, which in operation emits light through both flat sides of the sensor support surface and/or through both support flat sides of the decoration support medium. In other words the sensor assembly is back-lit, to achieve which all the layers of the sensor assembly through which the light of the lamp is to be emitted are then preferably implemented transparent or translucent.

Particularly preferably the lamp comprises an electroluminescence lamp having at least one light pigment layer between two electrode layers. Such an electroluminescence lamp, abbreviated as EL, can for example, be directly applied on the sensor support surface or the decoration support medium and also partially applied on both, for example by screen printing. A particularly advantageous embodiment is characterised in that the EL is a so-called inorganic EL, the light pigment layer of which can be excited to light up by application of an AC voltage between the two electrode layers. Such Els are simpler to produce than organic ELS and at the same time easier to handle, since they do not need to be protected so effectively against moisture. The overall structure of the sensor assembly including the lamp is therefore then more robust, and it can be assumed to have a longer lifetime. As an alternative to inorganic ELs, polymer organic ELs (POLEDs) can preferably be used, which, in contrast to so-called small molecule OLEDs (SM-OLEDs—organic ELs based on small organic molecules) can be produced by printing techniques similarly to inorganic ELs, and which enable a higher luminance to be achieved than inorganic ELs.

Preferably, the EL is applied directly or indirectly on at least one of the flat sides and/or support flat sides of the sensor support surface and/or the decoration support medium. This means that intermediate layers such as primers (adhesive primers), dielectrics or even the decoration layer or the contact or proximity sensor, can be arranged on the sensor support surface or the decoration support medium. Even multiple such intermediate layers present no obstacle. The EL can also be arranged partly on the sensor support surface and partly on the decoration support medium, for example one of the two electrode layers on the one component and the other on the other component, and the light pigment layer optionally on the one and/or the other. The EL then only becomes operational by the connection of the two components.

In principle, it is possible to arrange the lamp and the proximity and/or contact sensor on on different flat sides of the sensor support surface. However, it has proved particularly advantageous to position the lamp on the same flat side of the sensor support surface, on which the proximity and/or contact sensor is arranged. This enables an electrical contact to be made on only one flat side, which makes the assembly of the sensor assembly and also its maintenance significantly simpler.

The lamp, in particular an EL, and the proximity or contact sensor can be applied one on top of the other, with the electrode of the sensor even forming one of the two electrodes of the EL. Completely separated electrodes of the EL and the sensor can also be implemented however, which are then preferably electrically insulated from each other, for example, by means of an intermediate insulation layer.

The proximity and/or contact sensor and the lamp are preferably arranged side by side along an extension defined by the plane of extension of the sensor support surface. This even allows the lamp and the sensor to be arranged together on one and the same substrate and, if spaced sufficiently far apart, to be automatically insulated from each other. In this context, it is especially advantageous if the proximity and/or contact sensor is arranged in this extension around a region in which the lamp is positioned, or if the lamp is positioned in the extension around a region in which the proximity and/or contact sensor is positioned. Such an arrangement of the lamp around the sensor, or of the sensor around the lamp, particularly preferably has an annular design (that is, partially circular, oval or as part of an oval shape). Expressed more generally, a contour-tracking arrangement is preferably provided, in which the internal contour of the externally positioned lamp or of the externally positioned proximity and/or contact sensor is matched to the outer contour of the internally located proximity and/or contact sensor or of the internally located lamp.

Figure 2:
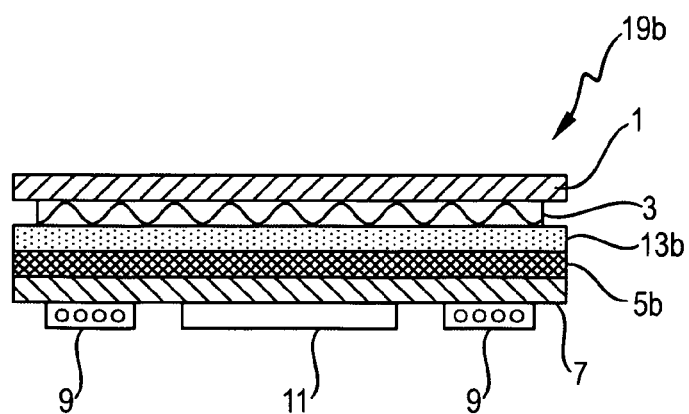
Figure 3:
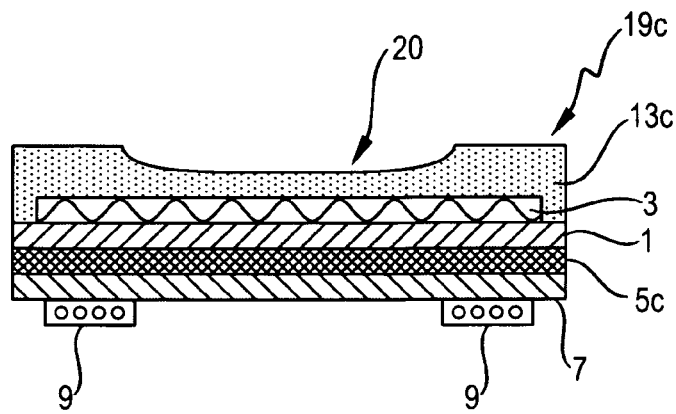
Figure 4:
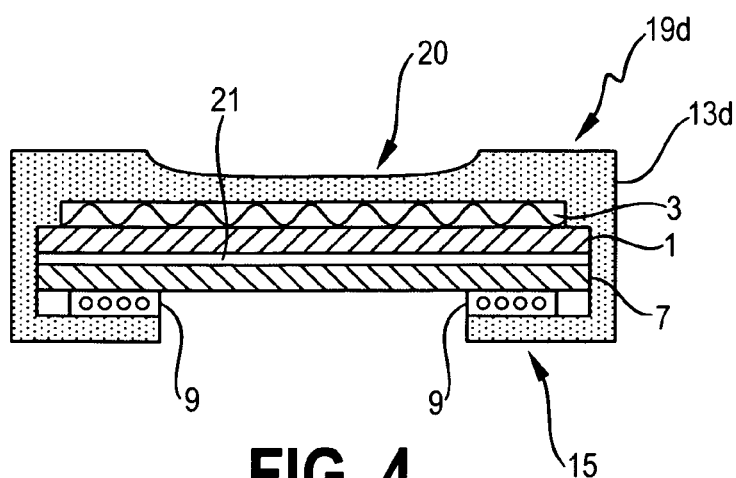
Figure 5:
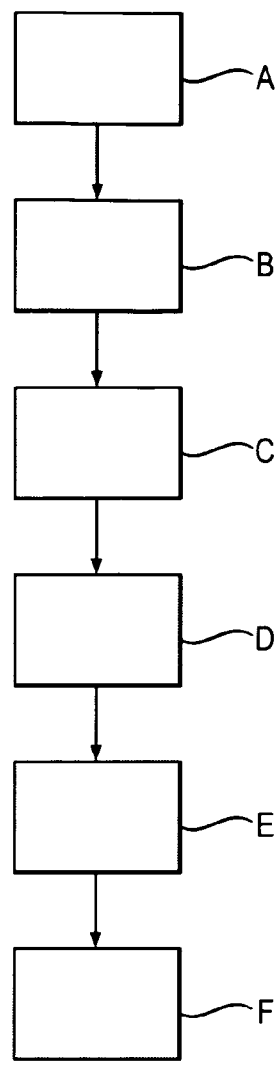
Figure 6:
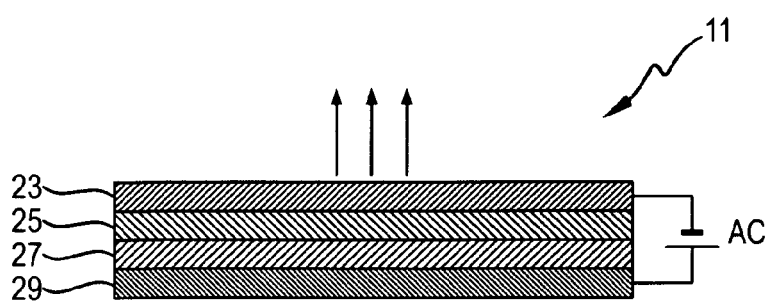

In the following the invention is explained once again in more detail with reference to the attached figures and based on an exemplary embodiment. Equivalent components in the various figures are each labelled with the same reference numerals. In the Figures:

FIG. 1 shows a schematic cross-sectional view of a first embodiment of a sensor assembly according to the invention, FIG. 2 a schematic cross-sectional view of a second embodiment of a sensor assembly according to the invention, FIG. 3 a schematic cross-sectional view of a third embodiment of a sensor assembly according to the invention, FIG. 4 a schematic cross-sectional view of a fourth embodiment of a sensor assembly according to the invention, FIG. 5 a schematic block diagram of a sequence of an embodiment of the method according to the invention, FIG. 6 a schematic cross-sectional view of an EL, as is preferably used in the embodiments of the sensor assemblies according to the invention in accordance with FIGS. 1 to 4.

FIGS. 1 and 2 show a sensor assembly 19a in a cross-sectional view. The sensor assembly 19a comprises a sensor support surface 7, here a film 7, with a first flat side 7' and a second flat side 7". On the second flat side 7" a proximity sensor 9 in the form of an electrode 9 is arranged in a ring, as well as a lamp 11, which is implemented as an EL 11. The more precise structure of an EL 11 that can be used for this purpose is shown in FIG. 6. The proximity sensor 9 is separated from the EL 11 such that the two are electrically insulated from each other, arranged annularly about the latter. As a result, in the entire region from the outer boundary of the proximity sensor 9 into the centre of the EL 11, a sensor action of the proximity sensor 9 is obtained if a user's finger, for example, approaches from the top of the sensor assembly 19a, i.e. from the side thereof opposite the proximity sensor 9. The decoration support medium 1, and also a film 1, has a first support flat side 1' and a second support flat side 1", wherein a decoration layer 3, here applied by printing, is arranged on the second support flat side 1". The decoration layer 3 is translucent, so that the light emitted by the EL 11 can radiate through it. The decoration support medium 1 and the sensor support surface 7 are transparent, so that the light from the EL 11 can radiate through it virtually unfiltered. On the first flat side 7' the sensor support surface 7 is indirectly connected to the decoration support medium 1 using a partial adhesive 5a. This is effected over part of the surface, i.e. by forming cutouts 6 in the adhesive 5a. By means of this partial bonding, the two connected components can be more easily detached from each other and can be recycled separately. Further advantages of this partial connection are described in detail above. In addition the decoration support medium is back-moulded with an injection-moulding material 13a. In this case this back-moulding 13a provides stabilisation of the overall assembly, so that the sensor assembly 19a forms a compact and solid assembly.

FIG. 2 shows a cross-sectional view of a second embodiment of a sensor assembly 19b according to the invention. This differs from the previously described structure in that adhesive 5b is now used over the whole surface. It is precisely in the surface connection of an injection-moulding material 13b to the film 7 where the best possible adhesion over the whole surface is often advantageous, since injection moulded parts often have very smooth surfaces. Against this background, a whole-surface bonding was selected here.

FIG. 3 shows a cross-sectional view of a third embodiment of a sensor assembly 19c according to the invention. Here, the decoration layer 3 is arranged on the (again, whole-surface) side of the decoration support medium 1 opposite the adhesive layer 5c, and a back-moulding 13c is applied on precisely this side. Since at the same time this side acts as a contact surface for touching with a finger or similar, the back-moulding 13c here is provided with a recess 20. This serves to improve the haptics and to identify the contact region of the sensor assembly 19c for visually impaired and blind people. Such a three-dimensional surface can be simply realized as part of the injection process in the case of a back-moulding process, so that this advantageous design introduces no significant overhead while at the same time allowing significantly increased usage. In addition, it should be noted that the sensor assembly 19c has no EL, but only acts as a sensor, with the decoration layer 3 together with the recess 20 providing all information necessary for the operation.

FIG. 4 shows a sectional view of a fourth design of a sensor assembly 19d according to the invention, which is substantially of analogous design to the sensor assembly 19c of FIG. 3. Instead of the adhesive connection 5c, in this case a clamping connection 15 is realized, which indirectly connects the decoration support medium 1 to the sensor support surface 7. The clamp connection 15 is formed by means of an appropriately adapted design of the back-moulding 13d. The sensor support surface 7 along with the proximity sensor 9 is clamped into the frame formed by the back-moulding 13d, wherein between the decoration support medium 1 and the sensor support surface 7 a small gap 21 is formed, here shown enlarged however.

FIG. 5 shows a schematic of the sequence of one embodiment of a manufacturing method according to the invention for producing the sensor assembly 19a, in accordance with FIG. 1. In a first step A the sensor support surface 7 is provided and in a second step B the proximity sensor 9 is connected thereto. In a third step C the decoration support medium is provided, to which in a fourth step D the decoration layer 3 is connected. The decoration support medium is then connected in a fifth step E to the injection-moulding material 13a and finally, in a step F, the decoration support medium 1 is connected to the sensor support surface 7.

FIG. 6 shows for purposes of explanation a schematic cross-sectional view of an EL 11, such as can be used, for example, in the previously described embodiments of the sensor assemblies 19a, 19b. It comprises a first electrode layer 23, a dielectric layer 27, a light pigment layer 25 and a second electrode layer 29. All of the layers 23, 25, 27, 29 are printed onto the second flat side 7" by the silk screen printing method (cf. FIGS. 1 and 2). By applying an AC voltage AC across the two electrode layers 23, 29, the light pigment layer 25 is excited into illumination. The first electrode layer 23 is transparent, while the second electrode layer 29 exhibits a light reflecting effect, so that the light is emitted upwards. The dielectric layer 27 is used to prevent flashovers between the two electrode layers 23, 29.

To conclude, it will once again be pointed out that the sensor assemblies described above are merely exemplary embodiments which can be modified in a variety of ways by the person skilled in the art without departing from the scope of the invention. Furthermore, the use of the indefinite article "a" does not exclude the possibility that the features concerned may also be present more than once.

LIST OF REFERENCE NUMERALS 1 decoration support medium—film
1' first support flat side 1" second support flat side
3 decoration layer
5a, 5b, 5c adhesive
6 cutouts
7 sensor support surface—film
7' first flat side
7" second flat side
9 proximity sensor—electrode
11 lamp—electro-luminescence lamp
13a, 13b, 13c, 13d back-moulding
15 clamp connection
19a, 19b, 19c, 19d sensor assembly
20 recess
21 gap
23 first electrode layer
25 light pigment layer
27 dielectric layer
29 second electrode layer
A step—providing a sensor support surface
B step—connecting the proximity sensor
C step—providing a decoration support medium
D step—connection of the decoration layer
E step—back moulding
F step—connecting

The invention claimed is:

1. A sensor assembly for detecting an approaching and/or contacting object, said sensor assembly comprising:
   a sensor support layer having a first flat side and a second flat side,
   a sensor connected to at least one of the first flat side and the second flat side of the sensor support layer for detecting at least one of contact and proximity of an object,
   a decoration support medium having a first support flat side and a second support flat side, the decoration support medium being at least partially translucent or transparent,
   a decoration layer, said decoration layer being at least one of connected to and integral with at least one of the first support flat side and the second support flat side of the decoration support medium,
   the decoration support medium including a glass or plastic film or panel,
   an injection-moulding material layer, the injection-moulding material layer being at least partially transparent and being located between the decoration layer and the sensor support layer,
   the decoration support medium being at least partially connected to the sensor support layer by at least one of the decoration layer, the injection-moulding material layer and an adhesive.

2. The sensor assembly according to claim 1, wherein the sensor support layer and the decoration support medium are partially connected to each other along one of the flat sides of the sensor support layer and one of the support flat sides of the decoration support medium.

3. The sensor assembly according to claim 1, wherein the sensor support layer and the decoration support medium are connected to each other by an adhesive connection.

4. The sensor assembly according to claim 3, wherein the adhesive connection has an adhesive surface with local cutouts.

5. The sensor assembly according to claim 3, wherein the adhesive connection has an adhesive surface, an adhesion effect of which is locally weakened, at least partially.

6. The sensor assembly according to claim 1, wherein the sensor support layer and the decoration support medium are connected to each other by a clamp connection.

7. The sensor assembly according to claim 6, wherein at least one of the decoration support medium, the injection-moulding material, and the sensor support layer form a clamping frame.

8. The sensor assembly according to claim 1, further comprising a lamp, which in operation emits light through at least one of both flat sides of the sensor support layer, and through both support flat sides of the decoration support medium.

9. The sensor assembly according to claim 8, wherein the lamp includes an electroluminescence lamp with at least one light pigment layer between two electrode layers.

10. The sensor assembly according to claim 9, wherein the electroluminescence lamp is mounted on at least one of at least one of the flat sides of the sensor support layer and at least one of the support flat sides of the decoration support medium.

11. The sensor assembly according to claim 8, wherein the lamp is positioned on a same flat side of the sensor support layer on which the sensor is arranged.

12. The sensor assembly according to claim 8, wherein the sensor and the lamp are arranged side by side along an extension defined by a plane of extension of the sensor support layer.

13. The sensor assembly according to claim 12, wherein the sensor is arranged in the extension about a region in which the lamp is positioned, or in which the lamp is arranged in the extension about a region in which the sensor is positioned.

14. A method for assembling a sensor assembly for detecting at least one of an approaching and a contacting object, said method comprising the following steps:
   providing a sensor support layer with a first flat side and a second flat side,
   connecting a sensor to at least one of the first flat side and the second flat side of the sensor support layer,
   providing a decoration support medium with a first support flat side and a second support flat side, the decoration support medium including a glass or plastic film or panel,
   connecting a decoration layer to at least one of the support flat sides of the decoration support medium and providing a decoration layer as an integral part of the decoration support medium,
   back-moulding of the decoration support medium on at least one of the first support flat side and the second support flat side with an injection-moulding material,
   connecting the decoration support medium to the sensor support layer,
      whereby at least one of (1) the decoration support medium is connected to the sensor support layer subsequently to the back-moulding step, and (2) the back-moulding of the decoration support medium and connecting the decoration support medium to the sensor support layer is carried out in a single operation step.

15. The method according to claim 14, wherein prior to the back-moulding the decoration support medium is subjected to a forming process.

* * * * *